(12) United States Patent
Bancel et al.

(10) Patent No.: US 7,694,197 B2
(45) Date of Patent: Apr. 6, 2010

(54) INTEGRATED CIRCUIT COMPRISING A TEST MODE SECURED BY DETECTION OF THE STATE OF A CONTROL SIGNAL

(75) Inventors: Frédéric Bancel, Lamanon (FR); David Hely, Les Pennes Mirabeau (FR)

(73) Assignee: STMicroelectronics, SA, Montrouge (FR)

( * ) Notice: Subject to any disclaimer, the term of this patent is extended or adjusted under 35 U.S.C. 154(b) by 779 days.

(21) Appl. No.: 11/484,359

(22) Filed: Jul. 10, 2006

(65) Prior Publication Data

US 2007/0033463 A1 Feb. 8, 2007

(30) Foreign Application Priority Data

Jul. 8, 2005 (FR) .................................. 05 07281
Jul. 8, 2005 (FR) .................................. 05 07282

(51) Int. Cl.
*G01R 31/28* (2006.01)
*G06F 11/30* (2006.01)

(52) U.S. Cl. ..................... 714/724; 714/729; 713/194

(58) Field of Classification Search ................ 714/724, 714/726, 729; 713/194
See application file for complete search history.

(56) References Cited

U.S. PATENT DOCUMENTS

| | | | |
|---|---|---|---|
| 5,293,610 A * | 3/1994 | Schwarz ..................... | 711/164 |
| 5,357,572 A | 10/1994 | Bianco et al. | |
| 5,452,355 A * | 9/1995 | Coli ........................... | 713/194 |
| 6,452,355 B2 * | 9/2002 | Forster et al. ............... | 318/569 |
| 7,076,667 B1 * | 7/2006 | Gama et al. ................. | 713/193 |
| 2003/0204801 A1 | 10/2003 | Tkacik et al. | |
| 2003/0206627 A1 | 11/2003 | Penugonda et al. | |
| 2003/0218475 A1 | 11/2003 | Gammel | |
| 2004/0093310 A1 | 5/2004 | Thomborson | |
| 2006/0200719 A1 | 9/2006 | Keller | |
| 2006/0239501 A1 | 10/2006 | Petrovic et al. | |
| 2007/0277225 A1 | 11/2007 | Rits et al. | |

FOREIGN PATENT DOCUMENTS

EP       1089083       4/2001

(Continued)

OTHER PUBLICATIONS

Scan Based Side Channel Attack on Dedicated hardware implementations of Data Encryption Standard by Yang et al. International Test Conference, Proceedings. ITC 2004. Publication Date: Oct. 26-28, 2004 pp. 339-344 ISBN: 0-7803-8580-2 INSPEC Accession No. 8291736.*

(Continued)

*Primary Examiner*—Cynthia Britt
(74) *Attorney, Agent, or Firm*—Lisa K. Jorgenson; Kevin D. Jablonski; Graybeal Jackson LLP

(57) ABSTRACT

An electronic circuit comprises configurable cells driven by command signals to adopt either a standard mode of operation in which they are integrated into a logic circuit, or a test mode in which they provide information on this logic circuit. The circuit includes a spy circuit capable of detecting an abnormal excitation of certain of the conductors through which the command signals travel, thus preventing fraudulent extraction of data out of the configurable cells. The spy circuit includes a logic combination circuit and a state detection cell.

25 Claims, 1 Drawing Sheet

FOREIGN PATENT DOCUMENTS

| | | |
|---|---|---|
| EP | 1439398 | 7/2004 |
| EP | 1443338 | 8/2004 |
| FR | 2865828 | 8/2005 |

OTHER PUBLICATIONS

"Automatic Test Equipment (ATE) on a Network (securing access tO equipment and data)" by McCarty, AUTOTESTCON Proceedings, 2000 IEEE Publication Date: 2000 On pp. 490-496 ISBN: 0-7803-5868-6 INSPEC Accession No. 6812928.*

David Hely, Frederic Bancel, Marie-Lise Flottes, Bruno Rouzeyre: "Test Control for Secure Scan Designs" Proceedings of the European Test Symposium 2005, IEEE 2005.

Michael J.Y. Williams and James B. Angell, "Enhancing Testability of Large-Scale Integrated Circuits via Test Points and Additional Logic" IEEE Transactions on Computers, vol. c-22, No. 1 Jan. 1973 pp. 46-60.

French Search Report for French Patent No. 0507282, INPI, Paris Apr. 13, 2006.

French Search Report for French Patent No. 0507281, INPI, Paris Apr. 13, 2006.

* cited by examiner

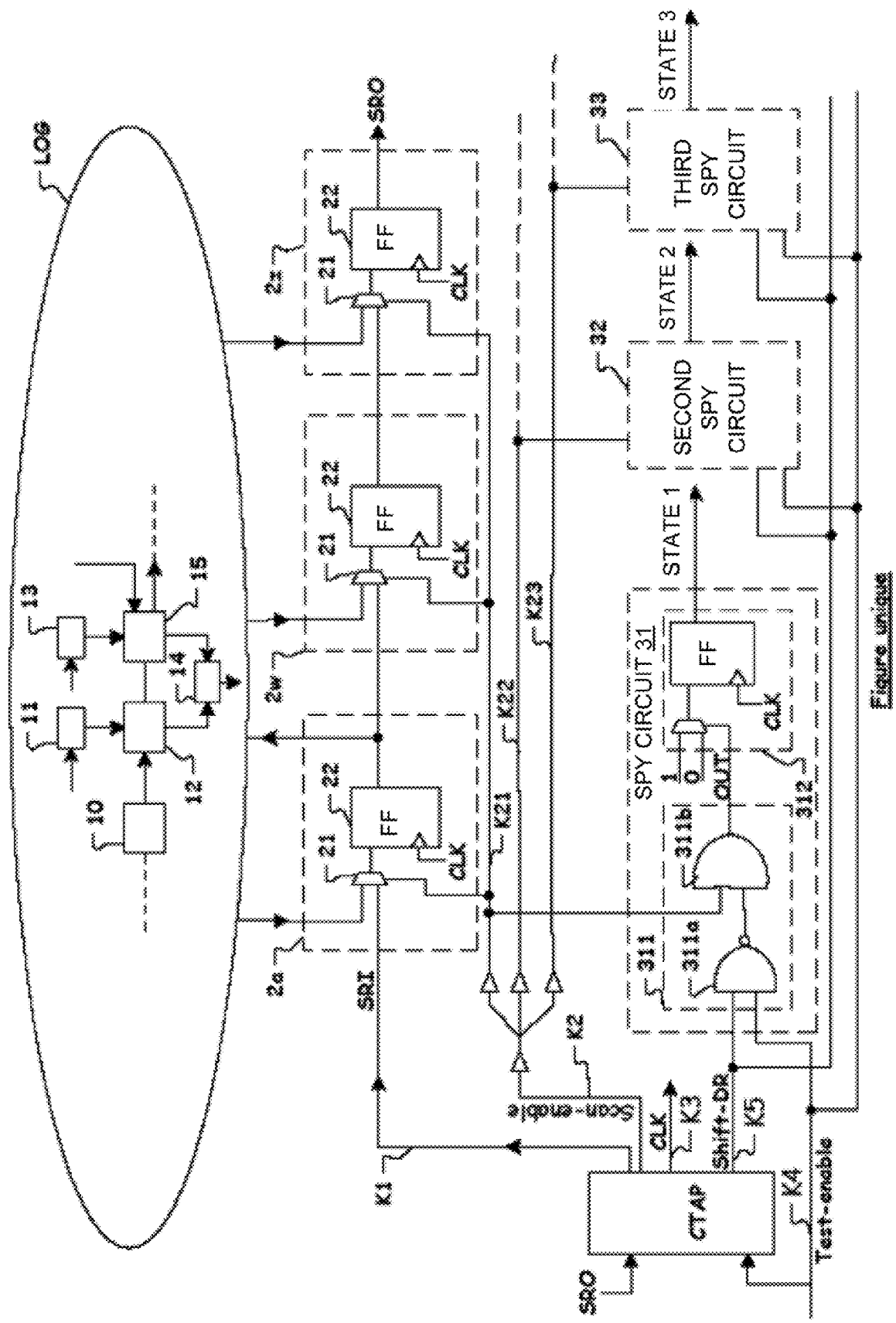

INTEGRATED CIRCUIT COMPRISING A TEST MODE SECURED BY DETECTION OF THE STATE OF A CONTROL SIGNAL

PRIORITY CLAIM

This application claims priority from French patent application Nos. 0507282, filed Jul. 8, 2005, and 0507281, filed Jul. 8, 2005, which are incorporated herein by reference.

CROSS REFERENCE TO RELATED APPLICATIONS

This application is related to U.S. patent application Ser. No. 11/484,355 entitled METHOD FOR TESTING AN ELECTRONIC CIRCUIT COMPRISING A SECURED TEST MODE, BY USING A SIGNATURE, AND ASSOCIATED ELECTRONIC CIRCUIT, which has a common filing date and owner and which is incorporated by reference.

TECHNICAL FIELD

An embodiment of the invention generally relates to synchronous electronic integrated circuits provided with combinatorial logic means, flip-flop circuits, and test means.

More specifically, an embodiment of the invention relates to an electronic circuit comprising a plurality of command lines, at least some of the lines being connected to configurable cells, and in which there selectively flow command signals received and/or sent in operation by a controller circuit such as an access controller, the configurable cells selectively adopting, as a function of the command signals, either a functional state in which the configurable cells are functionally connected to logic cells with which they cooperate to form at least one logic circuit, or in a chained state in which the configurable cells are functionally connected in a chain to form a shift register.

BACKGROUND

At present, there are well-known ways of testing for the proper working of the functional elements of an integrated circuit. This is done by the imposition and/or determination, at predefined instants, of the values of data present at certain internal points of this integrated circuit.

A technique of this kind for testing the internal paths of an integrated circuit, known as a "scanpath" or "internal scan method" is described for example in M. Williams and J. Angel, "Enhancing Testability of LSI Circuits Via Test Points and Additional Logic", IEEE Transactions on Computers, Vol. C-22, No. 1; January 1973, which is incorporated by reference.

In this technique, each of the flip-flop circuits of the logic circuit, for which it is necessary to know the state and/or dictate the content during the standard operation of the integrated circuit, is provided at one input with a multiplexer.

The different flip-flop circuits and the multiplexers that are associated with them thus constitute an equivalent number of configurable cells whose access points are controlled by these multiplexers.

The multiplexers of these different configurable cells are collectively controlled by a TAP (test access port) controller which, depending on a chosen mode of operation, uses this set of configurable cells either as a standard functional circuit integrated with the logic circuit that it forms with the logic cells, or as a test circuit.

To do this, the TAP controller receives control signals on different command lines and/or address lines by which it is connected to the different configurable cells. These command signals are for example a signal for commanding a passage into test mode, a chaining command signal, or again a data-propagation command signal that permits the modification of and/or modifies the data circulation paths within the integrated circuit and also enables the controller to capture this data for subsequent analysis.

In standard operating mode, the TAP controller therefore drives the multiplexers of the configurable cells so that the flip-flop circuits of these cells are connected to surrounding logic cells to define one or more functional sub-units of the integrated circuit.

In the test mode, which is normally activated upon reception by the TAP controller of the command signal commanding passage into a test mode, this controller produces a chaining command signal to set up a series connection of the flip-flop circuits of the configurable cells so as to form a shift register.

This register has a series input and a series output respectively connected to one output and to one input of the TAP controller, as well as a clock input receiving the data propagation command signal to set the rate of the datastream.

Initially, the TAP controller serially loads data into the flip-flop circuits of the configurable cells through the input of the shift register formed by these cells.

Then, the TAP controller changes the switching of the multiplexers to form the functional circuit, and commands the execution of one of more clock cycles by this functional circuit. In this phase, the data loaded into the flip-flop circuits of the configurable cells are processed by the functional circuit.

The controller then again changes the switching of the multiplexers to form the shift register once again and serially retrieves, at the output of this shift register, the data stored in the flip-flop circuits of the configurable cells during the last clock cycle.

Despite the confirmed value of this testing technique, its practical application can be a problem in certain circumstances, especially in integrated circuits that process secret data.

Because the activation of the test mode may enable an individual intent on fraud to read the contents of the flip-flop circuits of the configurable cells, this test has the drawback, in principle, of making such circuits very vulnerable to fraudulent use.

For example, by stopping a process of internal loading of secret data into the integrated circuit at various points in time, and by unloading the content of the shift register, an individual intent on fraud could obtain information on secret data or even reconstitute this secret data.

By activating the test mode, an individual intent on fraud could also obtain write access to the flip-flop circuits of the configurable cells to insert fraudulent data or else to place the integrated circuit in an unauthorized configuration. He could thus, for example, access a register controlling a security element such as a sensor to deactivate it. He could also inject a piece of erroneous data in order to obtain information on a piece of secret data.

The individual intent on fraud may actually adopt two different strategies: the first strategy consists in taking control of the TAP controller and observing the content of the cells of the shift register at the external pads; the second strategy consists in taking control of the configurable cells by exciting them by micro-probing so as to simulate the driving of these cells by the command signals emitted by the TAP controller.

A fraud attempt based on the second strategy can be thwarted by a technique that is the object of a patent application FR04/00837, which is commonly owned with the present application and which is incorporated by reference. The electronic circuit includes a spy circuit connected to a set of several command lines: at least a first one of these command lines is assigned to the transmission of the chaining command signal configuring the configurable cells as a shift register, at least a second one of these command lines is assigned to the transmission of the passage-to-test-mode command signal which activates the controller, and at least a third one is assigned to the transmission of the mode signal indicating the mode of operation of the controller. The spy circuit is a combinatorial logic circuit comprising a set of logic gates. The spy circuit combines all the signals received and produces an output signal representing an attempt at intrusion if the passage-to-test-mode command signal or the mode signal is inactive while the chaining command signal is active.

The circuit of FR04/00837 is efficient in detecting any intrusion into the circuit and any attempt to take over control of the shift register. However, the implementation of the combinatorial logic circuit as a spy circuit entails considerable excess costs for the manufacture of the circuit. In particular, the process of placing-routing the elementary components on silicon becomes more complex with an increased risk of error. This is because the placing-routing of the spy circuit is typically done manually, after the automatic placing/routing of the other elementary components, because the spy circuit is typically of a unique type and very different from the other components of the integrated circuit. It is thus often necessary to perform the following operations manually: identify all the signal lines, place the spy circuit in the vicinity of the other elementary components, appropriately route some of the lines to the spy circuit, make sure that the additional connections made manually will not disturb the working of the other elementary components owing to parasitic radiation, if any, caused by manual connections etc. Furthermore, if the placing/routing must be reiterated to optimize the entire circuit, then it may be necessary to reiterate the manual placing/routing of the spy circuit after each operation for the automatic placing/routing of the other components of the circuit.

SUMMARY

An embodiment of the invention is an electronic circuit comprising a spy circuit that has the general function described hereabove but is made differently, being designed to thwart a fraud attempt as efficiently as the electronic circuit of FR04/00837, but being easier and less costly to implement, especially as regards the placing-routing process on the electronic circuit.

To this end, an electronic circuit according to an embodiment of the invention, which is furthermore compliant with its generic definition given in the above introduction, is characterized by the fact that the spy circuit comprises:
   a combination circuit, carrying out a logic combination of the signals received on the set of command lines, and delivering at least one output signal in a first state if the passage-to-test-mode command signal or the mode signal is inactive, while the chaining command signal is active, and
   a state detection signal which produces a state signal representing the logic state of the output signal.

According to an embodiment of the invention, the state detection cell is made according to a diagram similar to the diagram of a configurable cell, whereas the signals applied to its state and selection inputs are different. The state detection cell thus comprises a first input and a second input to which a first piece of data and a second piece of data having different logic values are applied, a selection input to which the output signal of the combination circuit is applied, and an output at which the state signal is produced, this state signal being equal either to the first piece of data or to the second piece of data as a function of the value of the output signal of the combination circuit.

Since the state detection cell of the spy circuit is made similarly to the configurable cell of the electronic circuit, unlike the circuit disclosed in FR04/00837, no manual step is necessary. The detection cell can furthermore be integrated into the list of the elementary components of the circuit before the automatic placing/routing steps. The automatic placing/routing could be parametrized so that the detection cell or cells are close to the most sensitive configurable cells, in such a way that the detection cells and the configurable cells are connected to the same line conveying the chaining command signal. There is no longer any manual placing/routing step necessary for the implementation of the spy circuit. This approach prevents all the drawbacks of a manual placing/routing step such as difficulty of implementation, difficulty of integration, placing/routing errors, disturbance of other previously placed and routed components etc.

According to a first embodiment of the invention, the electronic circuit comprises a single spy circuit connected firstly to the lines on which the passage-to-test-mode command signal and the mode signal travel and, secondly, to a line on which the chaining command signal travels. In one example, the spy circuit may be connected directly to an output terminal of the control circuit at which the chaining command signal is produced. In another example, the spy circuit may be connected to a selection input of a configurable cell to which the chaining command signal is applied. In yet another example, the spy circuit is connected to a line connecting the terminal of the control circuit at which the chaining command signal is produced and the selection input of a configurable cell.

According to a second embodiment, the electronic circuit comprises several spy circuits, each being connected to a set of several command lines, of which the first line at least is chosen from among a group of several command lines assigned to the transmission of the chaining command signal, said first line being different from one spy circuit to another. Thus, several lines on which the chaining command signal travels are tested simultaneously.

It is possible for example to plan for as many spy circuits as there are lines capable of conveying the chaining command signal. The circuit is thus secured with the greatest efficiency since all the lines capable of transmitting the chaining command signal are tested.

Whatever the particular embodiment chosen, it is advantageous to plan for the output signal of the spy circuit to be conveyed to the configurable cells and for the flip-flop circuits of the configurable cells to be reset when the spy circuit adopts its state representing an attempted intrusion.

BRIEF DESCRIPTION OF THE DRAWING

Features and advantages of one or more embodiments of the invention shall appear more clearly from the following description, given by way of an indication that in no way restricts the scope of the invention, with reference to the appended single FIGURE which is a diagram illustrating an electronic circuit according to an embodiment of the invention.

DETAILED DESCRIPTION

As announced here above, an embodiment of the invention relates to an electronic circuit provided with internal test means.

Referring to FIG. 1, such a circuit typically comprises a plurality of logic cells such as the cells 10 to 15, a plurality of configurable cells such as the cells 2a, 2w and 2z, a plurality of command lines such as the lines K1 to K5 and K21 to K23 as well as, if necessary, a controller such as a test access port controller CTAP, which however may also be external to the electronic circuit considered.

Each of the configurable cells such as 2a, 2w and 2z comprises at least one multiplexer 21 and at least one flip-flop circuit 22.

The command lines K1 to K3 and K21 to K23, at least some of which are connected to the configurable cells 2a, 2w, and 2z, serve to transmit command signals that are selectively received and/or sent out in operation by the controller CTAP, such as a command signal TEST_ENABLE commanding passage into a test mode, which activates the controller CTAP, the chaining command signal SCAN_ENABLE, which chains the configurable cells in the form of a shift register, a command signal CLK, which enables the propagation of data in the configurable cells, and a mode signal SHIFT_DR, which indicates the mode of operation, standard or test mode, of the controller.

Depending on these command signals or on at least some of them, the configurable cells 2a, 2w and 2z adopt either a standard mode of operation, in which they are functionally linked to at least logic cells 10 to 15 with which they co-operate to form a logic circuit LOG, or a test mode in which these configurable cells 2a to 2z are functionally connected to one another in a chain to form a shift register.

The passage of the configurable cells from the standard operating mode to the test mode is done by the driving of the multiplexers 21 through at least some of the command signals delivered by the controller CTAP.

The shift register 2a to 2z especially has a data input SRI driven by one output of the controller CTAP, a data output SRO, connected to one input of the controller CTAP, and one clock input (not specifically represented) to receive a clock signal CLK capable of the setting the rate of the data flow in this shift register.

To launch a test, a signal TEST_ENABLE for commanding passage into test mode is first of all sent to the controller CTAP on the command line K4.

The controller CTAP then configures the configurable cells 2a to 2z as a shift register by sending the chaining command signal SCAN_ENABLE.

Then, by emitting the propagation command signal CLK, the controller CTAP serially loads test data into the flip-flop circuit 22 of these configurable cells through the input SRI of the shift register.

Then, by deactivating the chaining command signal SCAN_ENABLE, the controller CTAP reconfigures the configurable cells 2a to 2z into a functional element of the logic circuit LOG and commands the execution of one or more clock cycles by this functional element, which processes the test data.

By reactivating the chaining command signal SCAN_ENABLE, the controller CTAP again reconfigures the configurable cells 2a to 2z into a shift register.

Finally, by sending the propagation command signal CLK, the controller CTAP retrieves, at the output SRO of this register, the data stored in the flip-flop circuit 22 and coming from the processing of the test data by the logic circuit LOG.

To prevent a situation where an individual intent on fraud is able to simulate a test procedure of this kind by the direct application of command signals to the lines K1 to K5 and K21 to K23, and/or data to the input SRI, and thus make it difficult to impossible for this person to retrieve the data stored in the flip-flop circuits 22 that comes from the processing of the test data by the logic circuit LOG, the electronic circuit comprises a spy circuit 31 according to an embodiment of the invention.

The spy circuit 31 is connected to a set of several command lines K21, K4, K5: of these command lines, at least one first command conductor K21 is assigned to the transmission of the chaining command signal SCAN_ENABLE configuring the configurable cells as a shift register, at least one second command line K4 is assigned to the transmission of the passage-to-test-mode command signal TEST_ENABLE, which activates the controller, and at least one third command line K5 is assigned to the transmission of the mode signal SHIFT_DR indicating the mode of operation of the controller.

The spy circuit 31 includes a combination circuit 311 and a state detection cell 312.

The combination circuit 311 has the function of making a logic combination of the signals received on the set of command lines K21, K4, K5, and delivering at least one output signal OUT in a first state if the passage-to-test-mode command signal TEST_ENABLE or the mode signal SHIFT_DR is inactive, while the chaining command signal SCAN_ENABLE is active.

This state detection cell 312 has the function of producing a state signal STATE representing the logic state of the output signal OUT.

The spy circuit 31 thus has the function of delivering an output signal STATE1 whose state represents an absence of an anomaly or, on the contrary, an intrusion attempt.

More specifically, the output signal STATE1 of the spy circuit 31 adopts a state representing an absence of an anomaly or an intrusion attempt depending on whether or not the combination of the signals traveling on the command lines K21, K4, K5, under surveillance correspond to a combination of command signals observable in an authorized state of operation of the electronic circuit.

The spy circuit 31 thus makes use of the consistency that normally exists between the states taken, over time, by the different internal command signals of the electronic circuit in order to provide warning, if a break is detected in this consistency, that one of the command lines, normally traveled by a command signal governed by this consistency, has been attacked in order to be set at a value different from the value dictated by this very consistency.

In the example shown, the combination circuit 311 comprises a NAND type logic gate 311a and an AND logic gate 311b. The choice of the types of gates used naturally depends on the polarities of the logic control signals. The gate 311a has two inputs connected respectively to the lines K4 and K5, which are active at logic 1, and the gate 311b has two inputs respectively connected to the output of the gate 311a and to the line K21. The gate 311b produces a signal OUT at one output. This signal OUT is active if and only if the signal on the line K21 is active (logic 1) while one or both of the signals on the conductors K4 and K5 are inactive (logic 0). That is, if either TEST_ENABLE or SHIFT_DR is inactive logic 0, then the output of the NAND gate 311a is logic 1, which causes the signal OUT to equal SCAN_ENABLE. If SCAN_ENABLE=logic 1 (active)=OUT, then this indicates an attempt to scan out data while the circuitry is not in the test mode. Therefore, OUT=logic 1 (active) indicates a possible fraudulent intrusion, and causes STATE1 to equal a value that indicates a possible fraudulent intrusion. Conversely, when TEST_ENABLE=SHIFT_DR=logic 1 (active), then the output of the NAND gate 311a is logic 0, which causes OUT=logic 0, and which thus causes OUT and STATE1 to be inactive and thus to not indicate a possible fraudulent intrusion.

The state detection cell 312 is made according to an electronic diagram similar to the electronic diagram of the configurable cells 2a to 2z, and is connected similarly to the controller CTAP and to the clock circuit. The state detection cell 312 thus has a first input and a second input to which a first piece of constant data and a second piece of constant data, having different logic values, are applied, a selection input to which the output signal OUT of the combination circuit is applied, and an output at which the state signal STATE1 is produced, this state signal being equal either to the first piece of data or to the second piece of data depending on the value of the output signal OUT of the combination circuit.

In a first embodiment of the invention, the electronic circuit has a single spy circuit, connected to a line on which the chaining command signal travels. For example, the spy circuit is connected to the line K21 (see FIG. 1), which is itself connected to configurable cell selection inputs. In another example (not shown), the spy circuit 31 is connected to the conductor K2, at the output of the controller.

In a second embodiment, the electronic circuit has several spy circuits 31, 32, 33 (only three are shown), made according to identical diagrams. Each spy circuit 31, 32, 33, . . . is connected to a set of several command lines, of which the first line at least is chosen from among a set of several command lines K21, K22, K23, . . . , assigned to the transmission of the chaining command signal SCAN_ENABLE, said first line being different from one spy circuit to another. The other lines arriving at each spy circuit are respectively a line K4 conveying the passage-to-test-mode command signal TEST_ENABLE and a line K5 conveying the mode signal SHFT_DR.

In all cases, the output signals STATE1, STATE2, STATE3, . . . , of the spy circuit or circuits 31, 32, 33, . . . , are advantageously conveyed to the respective configurable cells 2a, 2w, and 2z and reset the flip-flop circuits 22 of these configurable cells when it assumes its state representing an intrusion attempt.

A circuit, such as shown in FIG. 1, according to an embodiment of the invention may be disposed on an Integrated Circuit (IC) such as a processor or a memory, and one or more such ICs may be disposed in an electronic system such as a computer system.

From the foregoing it will be appreciated that, although specific embodiments of the invention have been described herein for purposes of illustration, various modifications may be made without deviating from the spirit and scope of the invention.

LIST OF REFERENCES AND TERMS

LOG: combinatorial logic circuit
10 to 15: logic cells of the circuit LOG
2a to 2w, 2z: configurable cells
21, 22: multiplexer and flip-flop circuit of a configurable cell or of a state cell
CTAP: controller circuit such as a test access controller
K1, K2, K3, K4, K5: command lines
K21, K22, K23: command lines
31,32,33: spy circuit.
   311: combination circuit
   312: state detection cell
40, 40a, . . . , 40z: state cells CLK: clock signal, or data propagation signal
SCAN_ENABLE: chaining command signal
TEST_ENABLE: passage-to-test-mode command signal
SRI, SRO: input signals, output of the shift register
STATE1, STATE2, STATE3: state signals: output signals of the spy circuits 31, 32, 33, representing an absence of anomaly or an intrusion attempt.

What is claimed is:

1. An electronic circuit comprising:
a plurality of logic cells;
a plurality of configurable cells;
a plurality of command conductors, at least a part of them being connected to the configurable cells, and in which there selectively flow command signals received and/or sent in operation by a controller circuit such as an access controller, the configurable cells selectively adopting, as a function of the command signals, either a functional state in which the configurable cells are functionally connected to logic cells with which they co-operate to form at least one logic circuit or in a chained state in which the configurable cells are functionally connected in a chain to form a shift register; and
a spy circuit connected to a set of several command conductors, of which at least a first one is assigned to the transmission of the chaining command signal configuring the configurable cells as a shift register, at least a second one is assigned to the transmission of the passage-to-test-mode command signal which activates the controller and at least a third one is assigned to the transmission of a mode signal, of the controller; the spy circuit comprising,
a combination circuit carrying out a logic combination of the signals received on the set of command conductors, and delivering at least one output signal in a first state if the passage-to-test-mode command signal or the mode signal of the controller is inactive, while the chaining command signal is active, and
a state detection signal which produces a state signal representing the logic state of the output signal.

2. A circuit according to claim 1, wherein the state detection cell is made according to a topology similar to the topology of a configurable cell, the state detection cell comprising a first input and a second input to which a first piece of data and a second piece of data having different logic values are applied, a selection input to which the output signal of the combination circuit is applied, and an output at which the state signal is produced, the state signal being equal either to the first piece of data or to the second piece of data as a function of the value of the output signal of the combination circuit.

3. A circuit according to claim 1, comprising several spy circuits, each being connected to a set of several command conductors, of which the first conductor at least is chosen from among a group of several command conductors assigned to the transmission of the chaining command signal, said first conductor being different from one spy circuit to another.

4. A circuit according to claim 1, wherein the output signal of the spy circuit or circuits is conveyed to the configurable cells and reset a flip-flop circuit of these configurable cells when it is active.

5. An electronic circuit, comprising:
first logic cells configurable to compose a first logic circuit during a first operating mode and to compose a first shift register during a second operating mode;
a controller coupled to the logic cells and operable to, receive a first mode signal having a first level corresponding to the first operating mode and having a second level corresponding to the second operating mode, and generate a second mode signal having first and second levels that are respectively operable to configure the logic cells to compose the logic circuit and the shift register; and a spy circuit coupled to the controller and operable to generate a first warning signal if the second mode signal has the second level while the first mode signal has the first level.

6. The electronic circuit of claim 5 wherein each of the first logic cells comprises a respective flip flop.

7. The electronic circuit of claim 5 wherein:
the second operating mode comprises a scan-test mode;
the first mode signal comprises a test-enable signal;
the second mode signal comprises a scan-enable signal.

8. The electronic circuit of claim 5 wherein the second levels of the first and second mode signals each equal logic one.

9. The electronic circuit of claim 5 wherein:
the controller is operable to generate a third mode signal having a first level corresponding to the first operating mode and having a second level corresponding to the second operating mode; and
the spy circuit is operable to generate the warning signal if the second mode signal has the second level while either the first mode signal or the third mode signal has the respective first level.

10. The electronic circuit of claim 5 wherein:
the first logic cells are operable to store data; and
the warning signal is operable to modify the data stored in one of the first logic cells.

11. The electronic circuit of claim 5, further comprising a second logic cell configurable to compose the logic circuit with the first logic cells during the first operating mode.

12. The electronic circuit of claim 5, further comprising:
second logic cells configurable to compose a second logic circuit during the first operating mode and to compose a second shift register during the second operating mode;
wherein the controller is further operable to generate a third mode signal having first and second levels that are respectively operable to configure the second logic cells to compose the second logic circuit and the second shift register; and
wherein the spy circuit is operable to generate a second warning signal if the third mode signal has the second level while the first mode signal has the first level.

13. An electronic system, comprising:
an electronic circuit, comprising,
logic cells configurable to compose a logic circuit during a first operating mode and to compose a shift register during a second operating mode;
a controller coupled to the logic cells and operable to, receive a first mode signal having a first level corresponding to the first operating mode and having a second level corresponding to the second operating mode, and
generate a second mode signal having first and second levels that are respectively operable to configure the logic cells to compose the logic circuit and the shift register; and
a spy circuit coupled to the controller and operable to generate a warning signal if the second mode signal has the second level while the first mode signal has the first level.

14. The electronic system of claim 13 wherein the electronic circuit comprises an integrated circuit.

15. A method, comprising:
Receiving, at a first node, a first mode signal having a first level that corresponds to a first operating mode of a circuit;
simultaneously receiving, at a second node, a second mode signal having a second level corresponding to a second operating mode of the circuit;
generating a first warning signal in response to the second mode signal having the second level while the first mode signal has the first level; and
disabling operation of the circuit in response to the warning signal.

16. The method of claim 15 wherein:
the first mode signal comprises a test-enable signal;
the first operating mode comprises a non-test mode;
the second mode signal comprises a scan-enable signal; and
the second mode comprises a scan-test mode.

17. The method of claim 15, further comprising:
configuring logic cells as a scan-test shift register in response to the second mode signal having the second level, each of the logic cells storing respective data; and
modifying the data stored in at least one of the logic cells in response to the warning signal.

18. The method of claim 15, further comprising:
configuring logic cells as a scan-test shift register in response to the second mode signal having the second level, each of the logic cells storing respective data; and
erasing the data stored in at least one of the logic cells in response to the warning signal.

19. The method of claim 15 wherein:
the first level comprises a first logic level; and
the second level comprises a second logic level that is different than the first logic level.

20. The method of claim 15, further comprising:
receiving simultaneously with the first mode signal a third mode signal having a third level corresponding to the second operating mode; and
generating a second warning signal in response to the third mode signal having the third level while the first mode signal has the first level.

21. The method of claim 15 wherein receiving the first and second mode signals comprises receiving the first and second mode signals during the first operating mode.

22. A method, comprising:
receiving, at a first and second nodes respectively, first and second mode signals, at least one of the first and second mode signals having a first level that corresponds to a first operating mode of a circuit;
simultaneously receiving, at a third node, a third mode signal having a second level corresponding to a second operating mode of the circuit;
generating a first warning signal in response to the third mode signal having the second level while the at least one of the first and second mode signals has the first level; and
disabling operation of the circuit in response to the warning signal.

23. A method, comprising:
receiving, at a first node, a first mode signal having a first level that corresponds to a non-test operating mode of a circuit;

simultaneously receiving, at a second node, a second mode signal having a second level corresponding to a scan-test operating mode of the circuit; and disabling the circuit from operating in a scan-test mode in response to the second mode signal having the second level while the first mode signal has the first level.

24. The method of claim 23 wherein disabling the circuit comprises disabling logic cells from forming a shift-register.

25. The method of claim 23 wherein disabling the circuit comprises erasing data stored in a logic cell that composes a shift-register in response to the second mode signal having the second level.

* * * * *